United States Patent
Johnson et al.

(10) Patent No.: US 10,591,815 B2
(45) Date of Patent: Mar. 17, 2020

(54) SHIFTING OF PATTERNS TO REDUCE LINE WAVINESS

(71) Applicant: Applied Materials, Inc., Santa Clara, CA (US)

(72) Inventors: Joseph R. Johnson, Redwood City, CA (US); Christopher Dennis Bencher, Cupertino, CA (US); Thomas L. Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 16/021,350

(22) Filed: Jun. 28, 2018

(65) Prior Publication Data
US 2020/0004132 A1    Jan. 2, 2020

(51) Int. Cl.
G03F 1/00 (2012.01)
G03F 1/38 (2012.01)
H01L 21/027 (2006.01)
G03F 1/60 (2012.01)
G03F 1/26 (2012.01)

(52) U.S. Cl.
CPC .............. G03F 1/144 (2013.01); G03F 1/26 (2013.01); G03F 1/38 (2013.01); G03F 1/60 (2013.01); H01L 21/0274 (2013.01)

(58) Field of Classification Search
USPC ......................................................... 716/51
See application file for complete search history.

(56) References Cited

U.S. PATENT DOCUMENTS 9,791,786 B1    10/2017  Johnson et al.
2006/0105249 A1  5/2006  Kushida et al.
2008/0032203 A1  2/2008  Phillipps et al.
2010/0099049 A1* 4/2010  Owa ................... G03F 7/70291
                                              430/322
2012/0156814 A1* 6/2012  Hsieh ....................... G03F 1/34
                                              438/29

(Continued)

FOREIGN PATENT DOCUMENTS

JP    2008-300821 A    12/2008

OTHER PUBLICATIONS

PCT Notification of Transmittal of the International Search Report and the Written Opinion of the International Searching Authority for International Application No. PCT/US2019/032449; dated Aug. 23, 2019; 15 total pages.

*Primary Examiner* — Mohammed Alam
(74) *Attorney, Agent, or Firm* — Patterson + Sheridan LLP

(57) ABSTRACT

Embodiments described herein provide a method shifting mask pattern data during a digital lithography process to reduce line waviness of an exposed pattern. The method includes providing a mask pattern data having a plurality of exposure polygons to a processing unit of a digital lithography system. The processing unit has a plurality of image projection systems that receive the mask pattern data. Each image projection system corresponds to a portion of a plurality of portions of a substrate and receives an exposure polygon corresponding to the portion. The substrate is scanned under the plurality of image projection systems and pluralities of shots are projected to the plurality of portions while shifting the mask pattern data. Each shot of the pluralities of shots is inside the exposure polygon corresponding to the portion.

20 Claims, 6 Drawing Sheets

(56) References Cited

U.S. PATENT DOCUMENTS

| | | |
|---|---|---|
| 2017/0003598 A1 | 1/2017 | Johnson et al. |
| 2017/0068163 A1 | 3/2017 | Laidig et al. |
| 2017/0293232 A1 | 10/2017 | Johnson et al. |
| 2018/0267425 A1* | 9/2018 | Palmer ................ G03F 7/70558 |

* cited by examiner

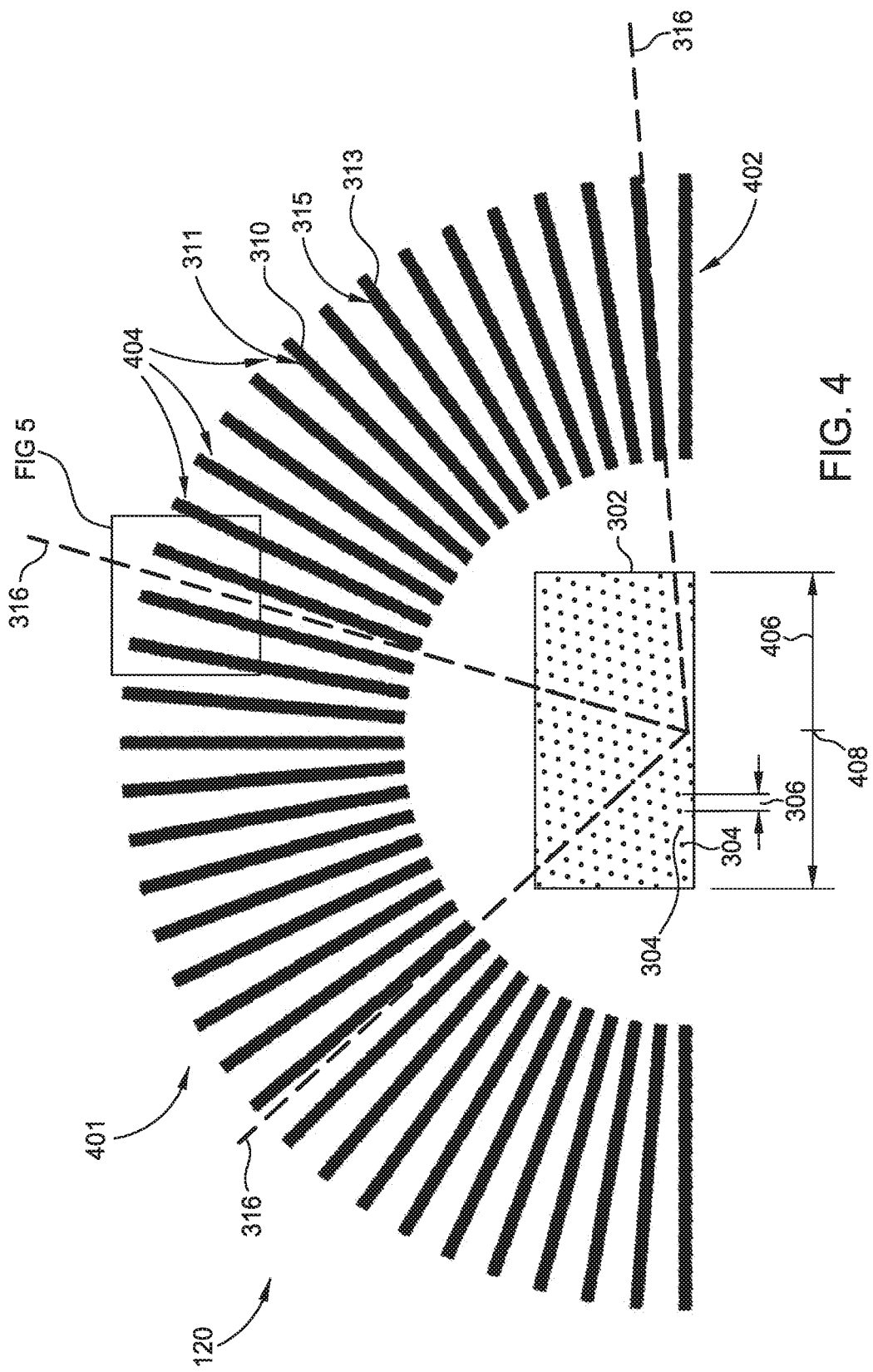

SHIFTING OF PATTERNS TO REDUCE LINE WAVINESS

BACKGROUND

Field

Embodiments of the present disclosure generally relate to photolithography systems. More particularly, embodiments of the present disclosure relate to a method of shifting patterns to reduce line waviness.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional digital lithography system utilizes a plurality of image projection systems. Each image projection system is configured to project a plurality of write beams into a photoresist layer on a surface of the substrate. Each image projection system projects the write beams to the surface of the substrate. A pattern, also known as a mask pattern, is written into the photoresist layer on the surface of the substrate by the write beams projected by the projection lens system. However, the mask pattern may have a jogging effect, also known as line waviness. Lines waviness may result in the eventual production of a lower quality display device.

Accordingly, what is needed in the art is a method of shifting patterns to reduce line waviness.

SUMMARY

In one embodiment, a method is provided. The method includes providing a mask pattern data having a plurality of exposure polygons to a processing unit of a digital lithography system. The processing unit has a plurality of image projection systems that receive the mask pattern data. Each image projection system corresponds to a portion of a plurality of portions of a substrate and receives an exposure polygon dataset corresponding to the portion. The substrate is scanned under the plurality of image projection systems and pluralities of shots are projected to the plurality of portions while shifting the mask pattern data. Each shot of the pluralities of shots is inside the exposure polygon corresponding to the portion. Shifting the mask pattern data includes shifting the mask pattern data to positions between a maximum shift and a minimum shift at a shifting frequency.

In another embodiment, a method is provided. The method includes providing a mask pattern data having a plurality of exposure polygons to a processing unit of a digital lithography system. The processing unit has a plurality of image projection systems that receive the mask pattern data. Each image projection system corresponds to a portion of a plurality of portions of a substrate and receives an exposure polygon corresponding to the portion. A plurality of spatial light modulator pixels of a spatial light modulator of each image projection system is arranged in the aggregated shot pattern with each spatial light modulator pixel corresponding to a potential shot of the aggregated shot pattern. The substrate is scanned under the plurality of image projection systems and pluralities of shots are projected to the plurality of portions while shifting the mask pattern data. Each shot of the pluralities of shots is inside the exposure polygon corresponding to the portion. Shifting the mask pattern data includes shifting the mask pattern data to positions selected by a random number generator between a maximum shift and a minimum shift at a shifting frequency. The maximum shift and the minimum shift are a percentage of a distance between adjacent potential shots of the aggregated shot pattern.

In yet another embodiment, a method is provided. The method includes providing a mask pattern data having a plurality of exposure polygons to a processing unit of a digital lithography system. The processing unit has a plurality of image projection systems that receive the mask pattern data. Each image projection system corresponds to a portion of a plurality of portions of a substrate and receives an exposure polygon corresponding to the portion. A plurality of spatial light modulator pixels of a spatial light modulator of each image projection system is arranged in the aggregated shot pattern with each spatial light modulator pixel corresponding to a potential shot of the aggregated shot pattern. The substrate is scanned under the plurality of image projection systems and pluralities of shots are projected to the plurality of portions while shifting the mask pattern data. Each shot of the pluralities of shots is inside the exposure polygon corresponding to the portion. Shifting the mask pattern data includes shifting the mask pattern data to positions selected by a random number generator between a maximum shift and a minimum shift at a shifting frequency. The maximum shift and the minimum shift are a percentage of a distance between adjacent potential shots of the aggregated shot pattern.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4 is a schematic, plane view of a substrate during a digital lithography process according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a method shifting patterns during a digital lithography process to reduce line waviness of an exposed pattern. The method includes providing a mask pattern data having a plurality of exposure polygons to a processing unit of a digital lithography system. The processing unit has a plurality of image projection systems that receive the mask pattern data. Each image projection system corresponds to a portion of a plurality of portions of a substrate and receives an exposure polygon corresponding to the portion. The substrate is scanned under the plurality of image projection systems and pluralities of shots are projected to the plurality of portions while shifting the mask pattern data. Each shot of the pluralities of shots is inside the exposure polygon corresponding to the portion. Shifting the mask pattern data includes shifting the mask pattern data to positions between a maximum shift and a minimum shift at a shifting frequency.

Figure 1:
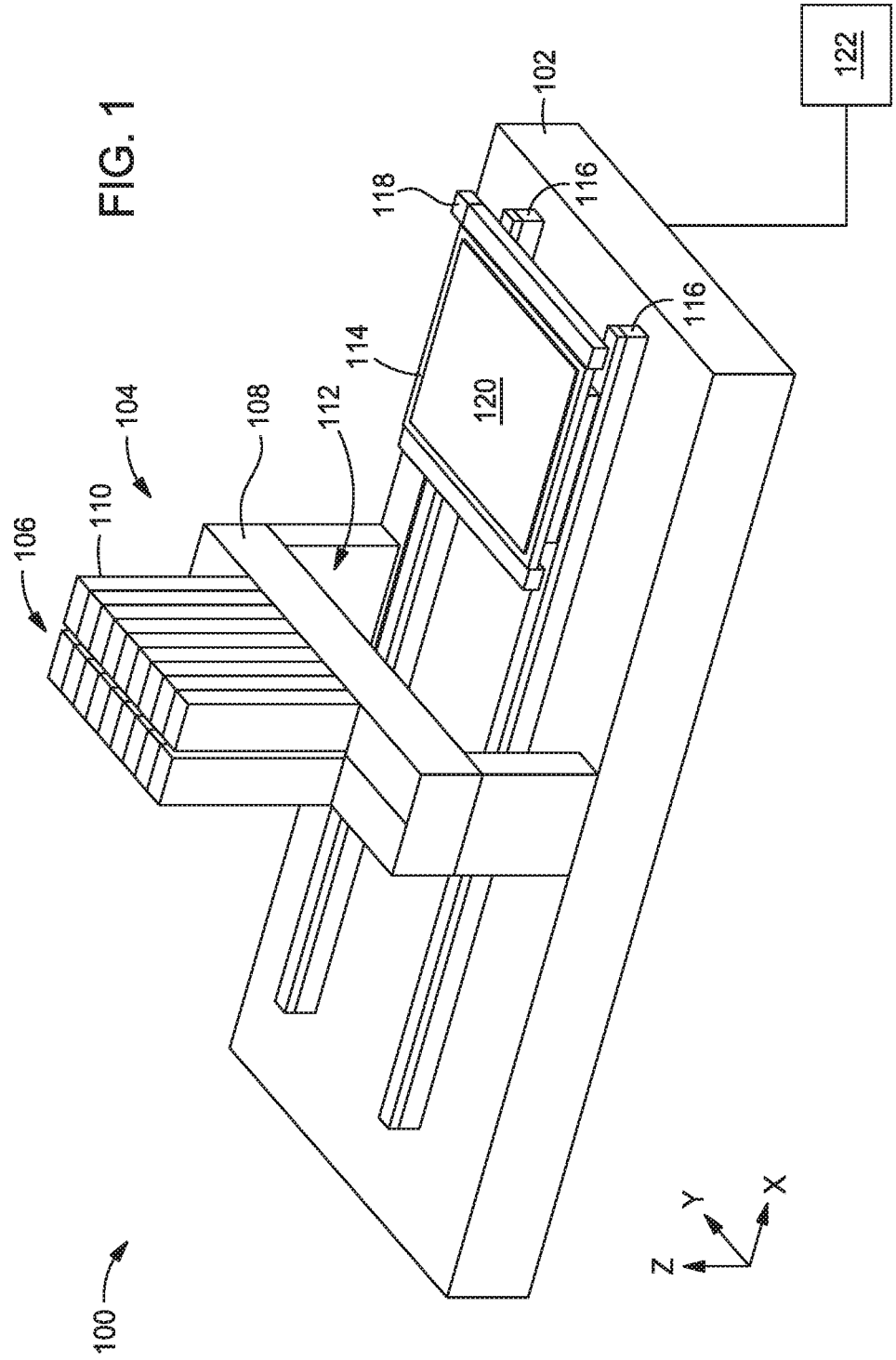
FIG. 1 is a perspective view of a system according to embodiments.

FIG. 1 is a perspective view of a system 100, such as a digital lithography system, that may benefit from embodiments described herein. The system 100 includes a stage 114 and a processing apparatus 104. The stage 114 is supported by a pair of tracks 116 disposed on a slab 102. A substrate 120 is supported by the stage 114. The stage 114 is supported by a pair of tracks 116 disposed on the slab 102. The stage 114 moves along the pair of tracks 116 in the X direction as indicated by the coordinate system shown in FIG. 1. In one embodiment, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of a method 600 of shifting patterns during a digital lithography process to reduce line waviness of an exposed pattern. A program (or computer instructions), which may be referred to as an imaging program, readable by the controller 122, determines which tasks are performable on a substrate. The program includes a mask pattern data and code to monitor and control the processing time and substrate position. The mask pattern data corresponding to a pattern to be written into the photoresist using the electromagnetic radiation.

The substrate 120 comprises any suitable material, for example, glass, which is used as part of a flat panel display. In other embodiments, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. In one embodiment, the processing unit 106 is a pattern generator configured to expose photoresist in a photolithography process. In some embodiments, the pattern generator is configured to perform a maskless lithography process. The processing unit 106 includes a plurality of image projection systems. One example of an image projection system is show in FIG. 2. In one embodiment, the processing unit 106 contains as many as 84 image projection systems. Each image projection system is disposed in a case 110. The processing unit 106 is useful to perform maskless direct pattern writing to photoresist or other electromagnetic radiation sensitive material.

During operation, the stage 114 moves in the X direction from a loading position, as shown in FIG. 1, to a processing position. The processing position is one or more positions under the processing unit 106. Herein, the system 100 is schematically shown, wherein the system 100 is sized to be capable of exposing the entire width of the photoresist layer on the substrate 120 in the Y direction, i.e. the substrate 120 is small compared to those of an actual flat panel display substrate. However, in an actual processing system, the processing apparatus 104 will be significantly smaller, in the Y direction, than the width of the substrate 120 in the Y direction, and the substrate 120 will be sequentially moved in the −X direction under the processing apparatus 104, moved or stepped in the +Y direction, scanned backed in the +X direction under the processing apparatus 104. This X direction scanning and Y direction stepping operation will continue until the entire substrate area has passed under the writable area of the processing apparatus 104.

Figure 2:
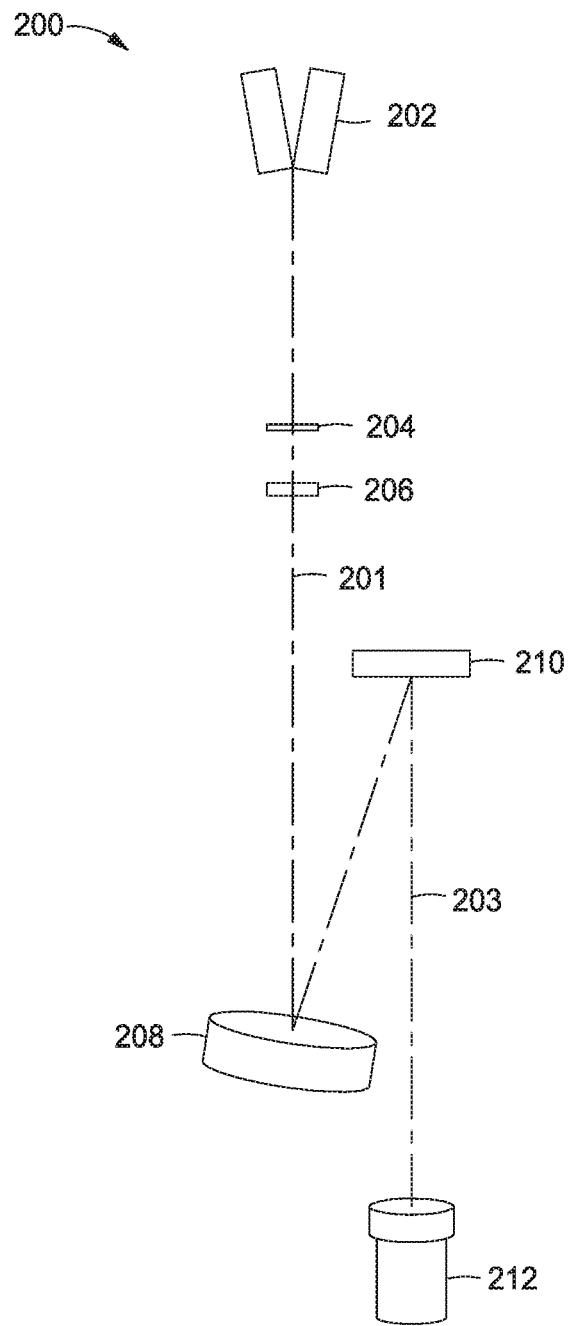
FIG. 2 is a schematic, cross-sectional view of an image projection system according to an embodiment.

FIG. 2 is a schematic, cross-sectional view of an image projection system 200 that may be used in system 100. The image projection system 200 includes a spatial light modulator 210 and projection optics 212. The components of the image projection system 200 vary depending on the spatial light modulator 210 being used. The spatial light modulator 210 includes, but is not limited to, an array of microLEDs, VCSELs, liquid crystal displays (LCDs), or any solid state emitter of electromagnetic radiation, and a digital micromirror device (DMD). The spatial light modulator 210 includes a plurality of spatial light modulator pixels. Each spatial light modulator pixel of the plurality of spatial light modulator pixels are individually controllable and are configured to project a write beam corresponding to a pixel of a plurality of pixels (shown in FIGS. 3A-3C). The compilation of plurality of pixels form of the pattern written into the photoresist, referred to herein as the mask pattern. The projection optics 212 includes projection lenses, for example 10× objective lenses, used to project the light onto the substrate 120. In operation, based on the mask pattern data provided to the spatial light modulator 210 by the controller 122, each spatial light modular pixel of the plurality of spatial light modulator pixels is at an "on" position or "off" position. Each spatial light modular pixel at an "on" position forms a write beam that the projection optics 212 then projects the write beam to the photoresist layer surface of the substrate 120 to form a pixel of the mask pattern.

In one embodiment, spatial light modulator 210 is a DMD. The image projection system 200 includes a light source 202, an aperture 204, a lens 206, a frustrated prism assembly 208, the DMD, and the projection optics 212. The DMD includes a plurality of mirrors, i.e, the plurality of spatial light modulator pixel. Each mirror of the plurality of mirrors corresponds to a pixel that may correspond to a pixel of the mask pattern. In some embodiments, the DMD includes more than about 4,000,000 mirrors. The light source 202 is any suitable light source, such as a light emitting diode (LED) or a laser, capable of producing a light having a predetermined wavelength. In one embodiment, the predetermined wavelength is in the blue or near ultraviolet (UV) range, such as less than about 450 nm. The frustrated prism assembly 208 includes a plurality of reflective surfaces. In operation, a light beam 201 having is produced by the light source 202. The light beam 201 is reflected to the DMD by the frustrated prism assembly 208. When the light beam 201 reaches the mirrors of the DMD, each mirror at "on" position reflect the light beam 201, i.e., forms a write beam, also known as a "shot", that the projection optics 212 then projects to shot the photoresist layer surface of the substrate 120. The plurality of write beams 203, also known as a plurality of shots, forms a plurality of pixels of the mask pattern.

Figure 3A:
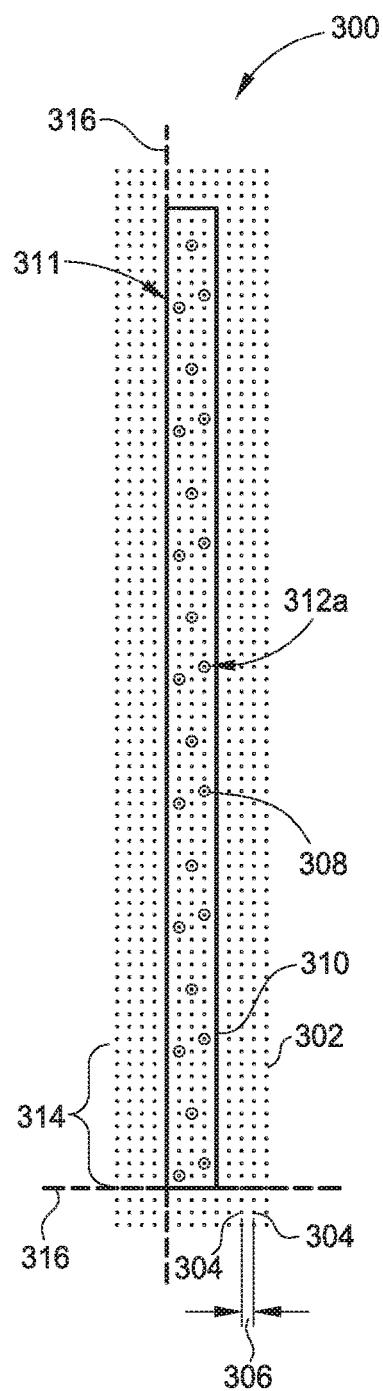
FIGS. 3A-3C are schematic, plane views of a portion of a substrate during a digital lithography process according to an embodiment.
Figure 3B:
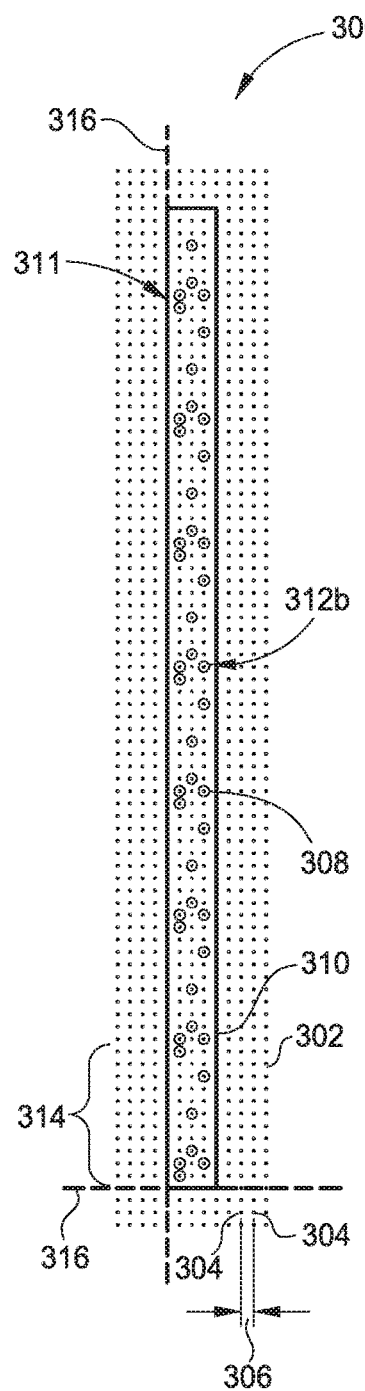
Figure 3C:
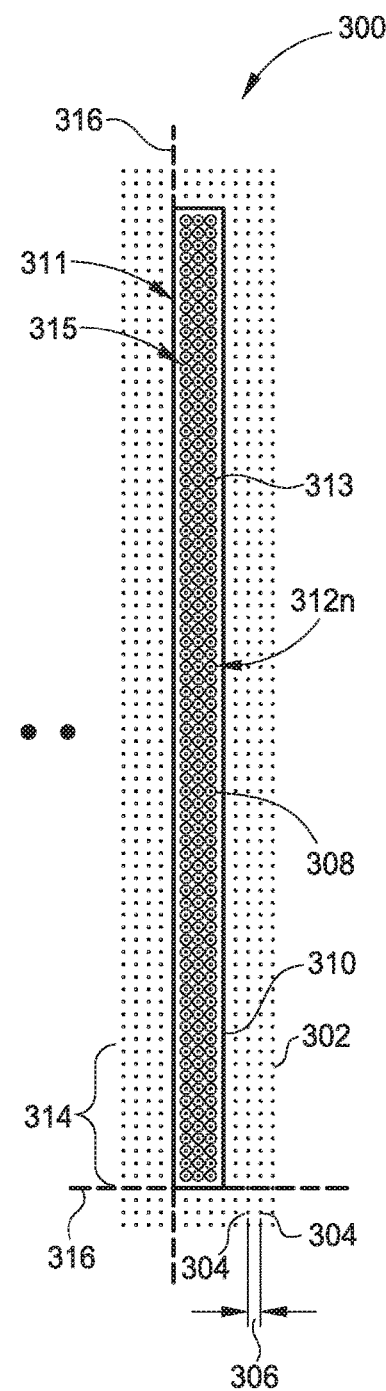

FIGS. 3A-3C are schematic, plane views of a portion 300 of the substrate 120 during a digital lithography process. As shown in FIGS. 3A-3C, an image projection system 200 corresponding to the portion 300 of the substrate 120 receives the mask pattern data (shown in FIG. 4) from the controller 122 corresponding to an exposure polygon 310 of the mask pattern (shown in FIG. 4) to be written into the photoresist by the image projection system 200. The plurality of spatial light modulator pixels of the spatial light modulator 210 are configured in an aggregated shot pattern 302 where each spatial light modulator pixel corresponds to a potential shot 304. Each potential shot 304 represents the centroid of a pixel. In one embodiment, the aggregated shot pattern 302 is a hexagonal close-packed (HCP) pattern, although other patterns may be used for the aggregated shot pattern 302. The aggregated shot pattern 302 has an aggregated shot pitch 306. The aggregated shot pitch 306 is the distance between adjacent potential shots 304. When the substrate 120 scans under the image projection system 200 the processing unit 106 projects the pluralities of shots to the portion 300 of the substrate 120. Each shot 308 of the pluralities of shots is inside the exposure polygon 310 of the mask pattern data.

As shown in FIG. 3A, a first plurality of shots 312a is projected to the portion 300 with each shot 308 inside the exposure polygon 310, and as shown in FIG. 3B, a second plurality of shots 312b is projected to the portion 300 with each shot 308 inside the exposure polygon 310 when the substrate 120 scans under the image projection system 200. As, shown in FIG. 3C, projecting pluralities of shots to the portion 300 of the substrate 120 is repeated until a final plurality of shots 312n of a predetermined number of shots are projected inside the exposure polygon 310, i.e, a predetermined of number pixels of the mask pattern are formed on the portion 300. The predetermined of number pixels of the mask pattern are formed on the portion 300 is defined as the patterned portion 313. Each plurality of shots has a stepping distance 314 between each potential shot 304. In one embodiment, the stepping distance 314 is a multiple of the aggregated shot pitch 306 such that the centroid of each subsequent shot of the plurality of shots is vertically aligned with each prior shot of the plurality of shots. FIGS. 3A-3C are an illustration of when the stepping distance 314 is a multiple of the aggregated shot pitch 306 and lines 311 of the exposure polygon 310 of the mask pattern data are aligned with lines of symmetry (LOS) 316 aggregated shot pattern 302 such that the edges 315 of the patterned portion 313 are substantially straight.

Figure 5:
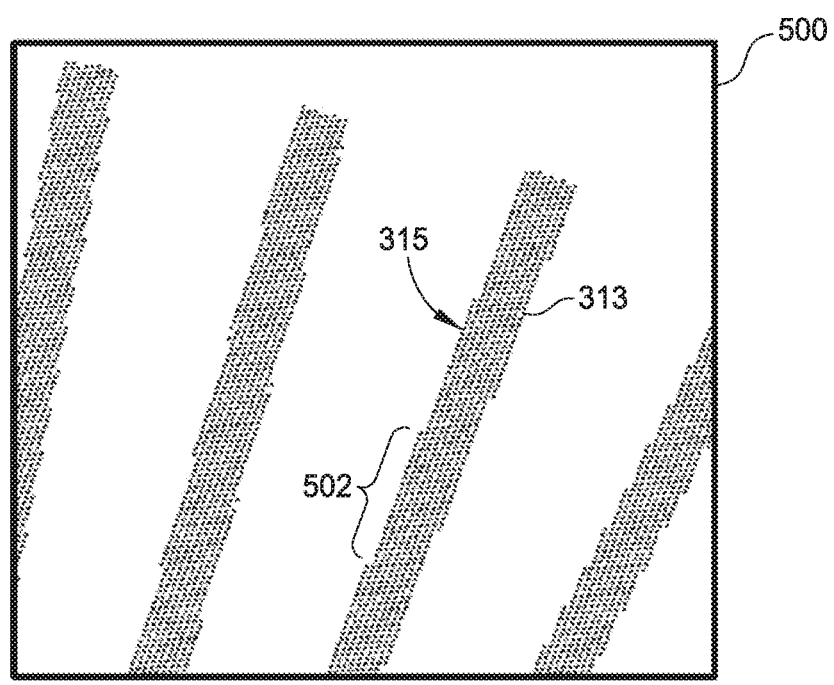
FIG. 5 is a schematic illustration of a qualification process according to one embodiment.

FIG. 4 is a schematic, plane view of the substrate 120 during a digital lithography process. As shown in FIG. 4, a mask pattern data 402 has a plurality of exposure polygons 404. The aggregated shot pattern 302 is a HCP pattern, although other patterns may be used for the aggregated shot pattern 302. Exposure polygons 310 of the plurality of exposure polygons 404 may have lines 311 with angles close to but not equal to the LOS 316 of the aggregated shot pattern 302 such that the edges (shown in FIG. 5) of the patterned portions 313 of a mask pattern 401 have a jogging effect, also known as line waviness. FIG. 5 is an exploded view of a segment 500 of the substrate 120. As shown in FIG. 5, the edges of the 315 of the patterned portions 313 have line jogs 502 causing the jogging effect. The lines 311 of the exposure polygons 310 having angles close to LOS close to but not equal to the LOS 316 of the aggregated shot pattern 302 result in the line jogs 502. A mask pattern 401 including patterned portion 313 having edges 315 with line jogs 502 may result in the eventual production of a lower quality display panel. Therefore, the digital lithography process must reduce line waviness of the edges 315 of patterned portions 313.

Figure 6:
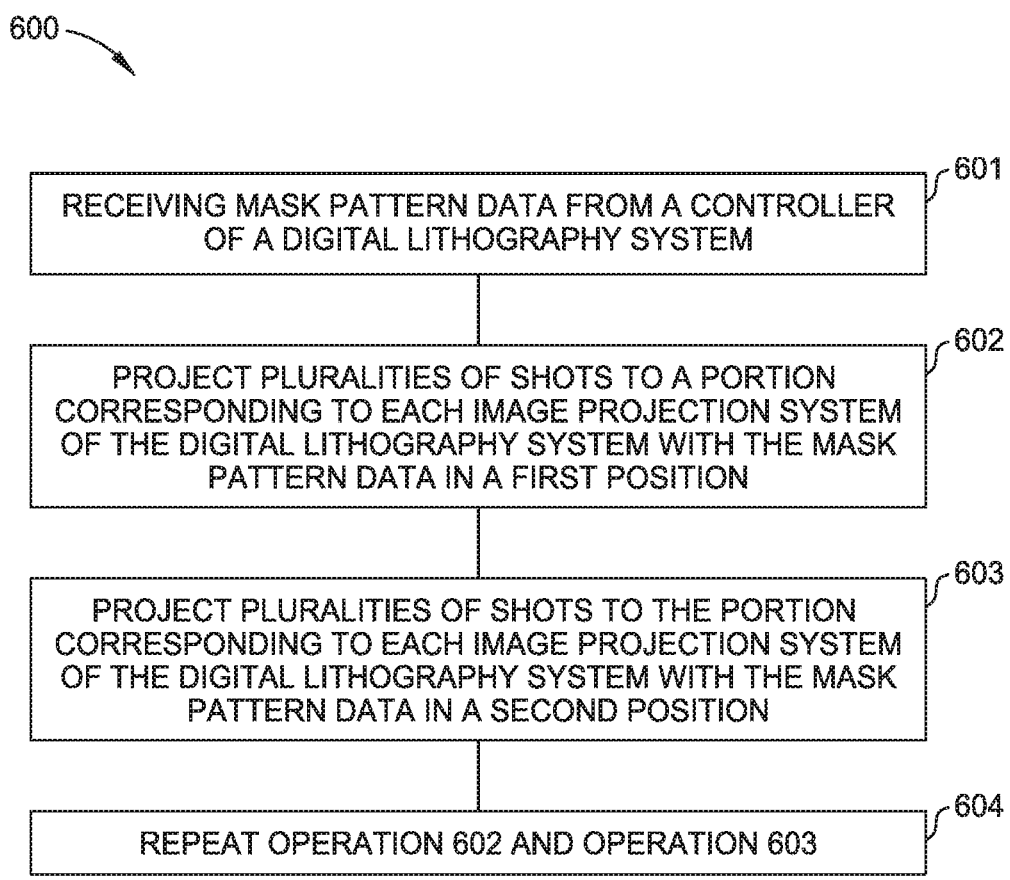
FIG. 6 is a flow diagram a method of shifting patterns to reduce line waviness of an exposed pattern according to an embodiment.

FIG. 6 is a flow diagram of the method 600 for shifting the mask pattern data 402 during a digital lithography process to reduce line waviness of the edges 315 of patterned portions 313. At operation 601, processing unit 106 having plurality of image projection systems receives mask pattern data 402 from the controller 122. Each image projection system 200 corresponds to a portion 300 of the substrate 120 and receives mask pattern data from the controller 122 corresponding to a dataset of the exposure polygon 310 of the mask pattern data 402. The plurality of image projection systems are configured to shift the mask pattern data 402 along a shifting axis 406 having an origin 408. The masked pattern data is shifted between a minimum shift and a maximum shift at a shifting frequency. The shifting frequency is less than about 80 microseconds (µs). An absolute value of the minimum shift and an absolute value of the maximum shift are equal. The minimum shift and maximum shift are a percentage of the aggregated shot pitch 306. In one embodiment, the percentage of the aggregated shot pitch 306 is between about 20% and about 40%.

At operation 602, each image projection system 200 projects pluralities of shots to the portion 300 corresponding to each image projection system 200 with the mask pattern data 402 in a first position. The first position is a first random distance between the minimum shift and the maximum shift generated by a random number generator with respect to the position of the origin 408. At operation 603, each image projection system 200 projects pluralities of shots to the portion 300 corresponding to each image projection system 200 with the mask pattern data 402 in a second position. The second position is a second random distance between the minimum shift and the maximum shift generated by the random number generator. At operation 604, operation 603 and operation 604 are repeated until i.e, a predetermined number pixels of the mask pattern 401 are formed on the photoresist layer surface of the substrate 120. Operations 603 and operations 604 are repeated at the shifting frequency. The method 600 for shifting the mask pattern data 402 reduces line waviness of the mask pattern 401 such that the edges 315 of the patterned portions 313 are substantially straight.

In summation, a method of shifting patterns during a digital lithography process to reduce line waviness of an exposed pattern is described herein. The utilization of between a minimum shift and a maximum shift at a shifting frequency allows the edges of the patterned portions to be substantially straight so that the line waviness of the mask pattern is reduced.

While the foregoing is directed to examples of the present disclosure, other and further examples of the disclosure may be devised without departing from the basic scope thereof, and the scope thereof is determined by the claims that follow.

What is claimed is:

1. A method, comprising:
providing a mask pattern data having a plurality of exposure polygons to a processing unit of a digital lithography system, the processing unit having a plurality of image projection systems that receive the mask pattern data, each image projection system corresponds to a portion of a plurality of portions of a substrate and receives an exposure polygon dataset corresponding to the portion; and
scanning the substrate under the plurality of image projection systems and projecting pluralities of shots to the plurality of portions while shifting the mask pattern data, each shot of the pluralities of shots is inside the exposure polygon corresponding to the portion, shifting the mask pattern data comprises shifting the mask pattern data to positions between a maximum shift and a minimum shift at a shifting frequency.

2. The method of claim 1, wherein the plurality of image projection systems are configured to shift the mask pattern data along a shifting axis having an origin.

3. The method of claim 2, wherein the positions are selected by a random number generator with respect to a position of the origin.

4. The method of claim 1, wherein a controller of the digital lithography system provides the mask pattern data to the processing unit.

5. The method of claim 1, wherein the shifting frequency is less than about 80 microseconds (μs).

6. The method of claim 1, wherein an absolute value of the minimum shift and an absolute value of the maximum shift are equal.

7. The method of claim 6, wherein the minimum shift and maximum shift are a percentage of an aggregated shot pitch.

8. The method of claim 7, wherein the aggregated shot pitch is a distance between adjacent potential shots of an aggregated shot pattern.

9. The method of claim 8, a plurality of spatial light modulator pixels of a spatial light modulator of each image projection system are arranged in the aggregated shot pattern.

10. The method of claim 9, wherein each spatial light modulator pixel corresponds to a potential shot of the aggregated shot pattern, and wherein a shot forms a pixel on a photoresist disposed on the substrate.

11. The method of claim 10, wherein the substrate is scanned under the plurality of image projection systems and the pluralities of shots are projected to the plurality of portions while shifting the mask pattern data until a predetermined number of pixels of a mask pattern are formed on the photoresist.

12. The method of claim 8, the minimum shift and maximum shift are a percentage of the aggregated shot pitch.

13. The method of claim 12, the percentage of the aggregated shot pitch is between about 20% and about 40%.

14. A method, comprising:
providing a mask pattern data having a plurality of exposure polygons to a processing unit of a digital lithography system, the processing unit having a plurality of image projection systems that receive the mask pattern data, each image projection system corresponds to a portion of a plurality of portions of a substrate and receives an exposure polygon dataset corresponding to the portion, and a plurality of spatial light modulator pixels of a spatial light modulator of each image projection system is arranged in the aggregated shot pattern with each spatial light modulator pixel corresponding to a potential shot of the aggregated shot pattern;
scanning the substrate under the plurality of image projection systems; and
projecting pluralities of shots to the plurality of portions while shifting the mask pattern data, each shot of the pluralities of shots is inside the exposure polygon corresponding to the portion, shifting the mask pattern data comprises:
shifting the mask pattern data to positions selected by a random number generator between a maximum shift and a minimum shift at a shifting frequency, the maximum shift and the minimum shift are a percentage of a distance between adjacent potential shots of the aggregated shot pattern.

15. The method of claim 14, wherein a controller of the digital lithography system provides the mask pattern data to the processing unit.

16. The method of claim 14, wherein the shifting frequency is less than about 80 microseconds (μs).

17. The method of claim 14, wherein an absolute value of the minimum shift and an absolute value of the maximum shift are equal.

18. The method of claim 14, the percentage of the aggregated shot pitch is between about 20% and about 40%.

19. The method of claim 14, wherein the plurality of image projection systems are configured to shift the mask pattern data along a shifting axis having an origin, and wherein the positions are selected by a random number generator with respect to a position of the origin.

20. A method comprising:

providing a mask pattern data having a plurality of exposure polygons to a processing unit of a digital lithography system, the processing unit having a plurality of image projection systems that receive the mask pattern data, each image projection system corresponds to a portion of a plurality of portions of a substrate and receives an exposure polygon dataset corresponding to the portion, and a plurality of spatial light modulator pixels of a spatial light modulator of each image projection system is arranged in the aggregated shot pattern with each spatial light modulator pixel corresponding to a potential shot of the aggregated shot pattern;

scanning the substrate under the plurality of image projection systems; and projecting pluralities of shots to the plurality of portions while shifting the mask pattern data until a predetermined number of pixels of a mask pattern is formed on a photoresist on the substrate, each shot of the pluralities of shots is inside the exposure polygon corresponding to the portion, shifting the mask pattern data comprises:

shifting the mask pattern data to positions selected by a random number generator between a maximum shift and a minimum shift at a shifting frequency, the maximum shift and the minimum shift are a percentage of a distance between adjacent potential shots of the aggregated shot pattern, and the plurality of image projection systems are configured to shift the mask pattern data along a shifting axis having an origin wherein the positions are selected by a random number generator with respect to a position of the origin.

* * * * *